US006993730B1

(12) United States Patent
Higgins et al.

(10) Patent No.: US 6,993,730 B1
(45) Date of Patent: Jan. 31, 2006

(54) METHOD FOR RAPIDLY DETERMINING THE FUNCTIONAL EQUIVALENCE BETWEEN TWO CIRCUIT MODELS

(75) Inventors: Joseph E. Higgins, Albany, CA (US); Vigyan Singhal, Fremont, CA (US); Adnan Aziz, Austin, TX (US)

(73) Assignee: Tempus Fugit, Inc., Albany, CA (US)

(*) Notice: Subject to any disclaimer, the term of this patent is extended or adjusted under 35 U.S.C. 154(b) by 0 days.

(21) Appl. No.: 09/758,524

(22) Filed: Jan. 10, 2001

(51) Int. Cl.
   *G06F 17/50* (2006.01)

(52) U.S. Cl. .............................................. 716/3; 716/2
(58) Field of Classification Search ................ 716/1–14
   See application file for complete search history.

(56) References Cited

U.S. PATENT DOCUMENTS

| | | | | |
|---|---|---|---|---|
| 5,243,538 | A | * | 9/1993 | Okuzawa et al. ............... 716/5 |
| 5,638,381 | A | | 6/1997 | Cho et al. ................... 371/22.4 |
| 5,754,454 | A | | 5/1998 | Pixley et al. ................ 364/580 |
| 5,856,926 | A | * | 1/1999 | Matsumoto et al. .......... 716/18 |
| 5,909,374 | A | * | 6/1999 | Matsunaga ..................... 716/18 |
| 5,949,691 | A | | 9/1999 | Kurosaka et al. ............ 364/489 |
| 6,056,784 | A | * | 5/2000 | Stanion ......................... 703/15 |
| 6,308,299 | B1 | * | 10/2001 | Burch et al. .................... 716/3 |

FOREIGN PATENT DOCUMENTS

JP           409198412 A    *    7/1997

OTHER PUBLICATIONS

Huang, et al., "AQUILA: An Equivalence Checking System for Large Sequential Designs," *Final Manuscript of Trans. On Computer SIDC–64–R2*, pp. 1–36.

Eijk, Cornelis A.J. van, "Formal Methods for the Verification of Digital Cirucits," *CIP–Data Library Technische Universiteit Eindhoven*, pp. v–143, 1997.

Mukherjee, et al., "FLOVER: Filtering Oriented Combination Verification Approach".

Kunz, Wolfgang, "A Novel Framework for Logic Verification in a Synthesis Environment," *IEEE Transactions on Computer–Aided Design of Integrated Circiuts and Systems*, vol., 15, No. 1, Jan. 1996, pp. 20–32.

Brand, Daniel, "Verification of Large Synthesized designs," *Proc. Intl. Conf. On Computer–Aided Design (ICCAP)*, 1993, pp. 534–537.

Kuehlmann, Andreas, "Equivalence Checking Using Cuts and Heaps," IBM Thomas J. Watson Research Center, Yorktown Heights, NY U.S. A.

Matsumaga, "An Efficient Equivalence Checker for Combination Circuits," Fujitsu Laboratories, LTD, $33^{rd}$ Design Automation Conference, Kawasaki 211–88, Japan.

Pradhan, et al., "VERILAT: Verification Using Logic Augmentation and Transformations," ICCAD, 1996.

Burch, et al., "Tight Integration of Combination Verification Methods," Cadence Berkeley Labs, Berkeley, CA.

Bryant, Randal E., "Graph–Based Algorithms for Boolean Function Manipulation," *IEEE Transaction on Computers*, vol. C–35, No. 8, Aug. 1986, pp. 677–691.

Foster, Harry, "Techniques for Higher–Performance Boolean Equivalence Verification," *The Hewlett–Packard Journal*, Article 3, 1998, pp. 30–38.

Jain, et al., "Advance Verification Techniques Based on Learning," $32^{nd}$ ACM/IEEE Design Automation Conference.

Tafertshofer, et al., *A SAT–Based Implication Engine for Efficient ATPG, Equivalence Checking, and Optimization for Netlists*, IEEE, 1997.

Kuehlmann, et al., "Error Diagnosis for Transistor–Level Verification,".

Eijk, C.A.J. van, et al., "Exploiting Functional Dependencies in Finite State Machine Verification," *Design Automation Section, Eindhoven University of Technology*.

Eijk, C.A.J. van, et al., "Exploiting Structural Similarities in a BDD–based Verification Method," *Eindoven University of Technology, Department of Electrical Engineering*.

\* cited by examiner

*Primary Examiner*—Vuthe Siek
*Assistant Examiner*—Sun James Lin
(74) *Attorney, Agent, or Firm*—Pillsbury Winthrop LLP

(57) ABSTRACT

This invention determines whether two circuit models have equivalent functionality. The method allows very fast comparison between two circuits taking advantage of previous work done. Whenever an apparatus associated with the method solves a problem, it stores information that learned during the solution of the problem, in a database. If the apparatus is presented with a new problem of determining equivalence between two portions of two circuits, it checks if it has seen sub-circuits similar to either of the two pieces before. If it has, it uses the knowledge cached during the previous checks to make the new check easier. Checking equivalence of two circuit models involves checking equivalence of many pairs of sub-parts. Even when the subsequent comparisons involve different circuits, it is possible to take advantage of the information acquired during previous equivalence checks.

22 Claims, 16 Drawing Sheets

Stage 2

Stage 3

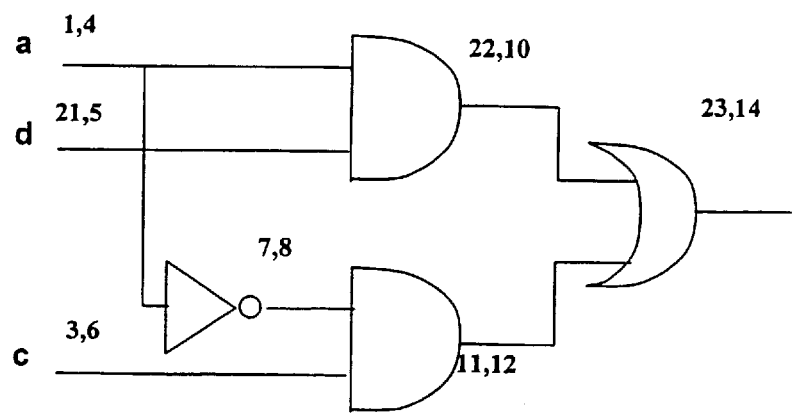
FIG. 10
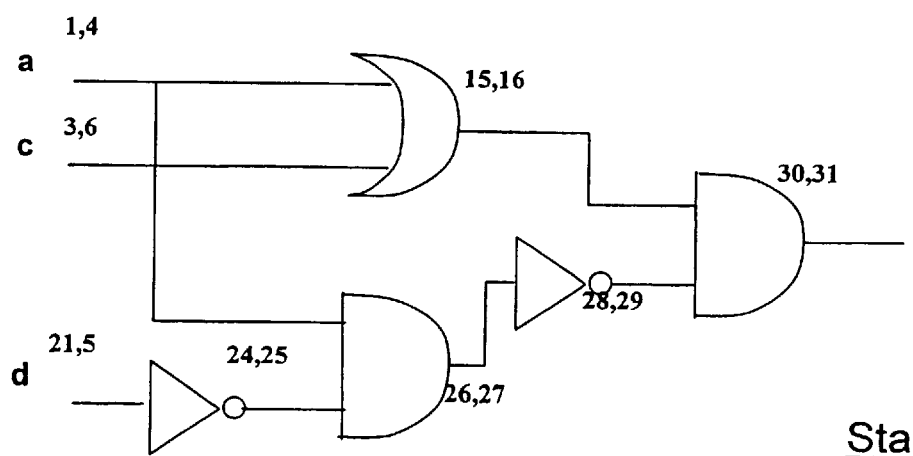

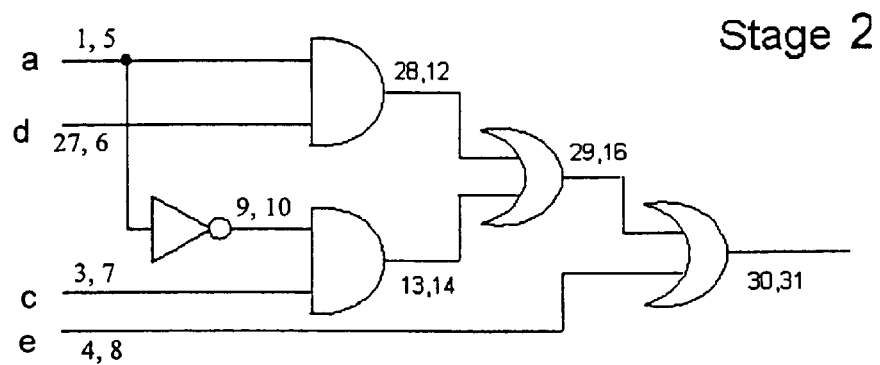
FIG. 13
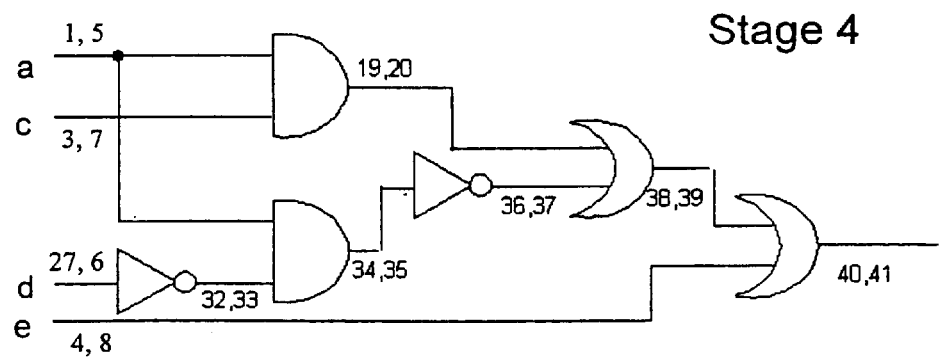

Stage 2

Stage 4

METHOD FOR RAPIDLY DETERMINING THE FUNCTIONAL EQUIVALENCE BETWEEN TWO CIRCUIT MODELS

BACKGROUND OF THE INVENTION

1. Field of the Invention

The present invention relates to hardware circuit verification; specifically, it relates to verifying whether two different circuits have identical functionality. The present invention particularly relates to a logic verification method that caches knowledge acquired while verifying two subcircuits, and uses this knowledge in future subcircuit comparisons.

2. Background of the Related Art

Recent increases in the complexity of modem integrated circuits have resulted in corresponding increases in the difficulty of verifying design correctness. Design flaws have significant economic impact both in terms of increased time-to-market and in reduced profit margins. A typical design flow has many steps, each of which can introduce design flaws. Traditionally, simulation-based techniques have been used to verify design correctness. These techniques have become less effective because of their inability to completely and quickly verify large designs. An increasingly popular alternative is the use of formal mathematical techniques, employed by tools known as equivalence checkers, to verify design correctness.

A typical design flow where an integrated circuit is taken from concept to fabrication includes a number of steps. As a first step, the conceptual nature of the integrated circuit is determined. The desired functionality of a circuit is described by a set of specifications. A conceptual model of the circuit is created based on the specifications. For example, in the case of a complex microprocessor, the conceptual nature of the circuit is typically specified in a high level language such as C++. Modeling tools are available which simulate the behavior of the conceptual model under specific test cases to ensure.that the model performs as expected.

Once the conceptual nature of the circuit is determined, a register transfer level (RTL) model of the digital circuit is built based upon the conceptual model and is modeled on a digital computer using an RTL modeling tool. At this stage, the design of the circuit, as modeled by the RTL modeling tool, may be used to verify that the circuit meets the desired specifications. In some cases the RTL modeling tool may allow the validity of the modeled circuit to be checked in the context of the high-level language model.

After the design of the RTL model is completed, it is transformed into a gate level model in which individual logic gates are specified and connected together to perform the same logic functions as the RTL level circuit model. The transformation process is error-prone due to both human error and tool error. To validate the transformation, the logic functions of the gate level model must be verified to be the same as the corresponding functions in the RTL model. An equivalence checking tool can be used to perform this verification.

The gate level model is often further transformed by optimizations that attempt to improve the performance of the circuit such as reducing the area required to construct the circuit, increasing the speed of operation of the circuit and reducing the power consumption of the circuit. Once the gate level logic of the circuit model has been optimized, the optimized gate level model operation must be verified with respect to either the RTL level model or the original gate level model.

The gate level model may go though additional transformations, each yielding successive versions of the circuit. An example of this transformation is scan logic insertion, which allows the circuit to perform in a scan mode and a normal mode. When operating in scan mode the circuit can be tested for manufacturing defects, while in normal mode the circuit should behave as before. Another example is clock tree insertion, which is the process of inserting buffers in the clock tree to improve the timing of clock signals.

At some stage the gate level circuit is placed and routed into a layout. This step may involve further transformations and local optimizations that are driven by placement and timing constraints. Each transformation necessitates the verification of functionality of the pre-transformation version compared with the post-transformation version of the circuit.

These stages in the design flow are usually predetermined and fixed for each specific organization doing circuit design. For example, one particular organization may have the following design stages:

Stage 1: hierarchical RTL design;
Stage 2: hierarchical synthesized design;
Stage 3: hierarchical scan-inserted design;
Stage 4: hierarchical placement-based optimized design;
Stage 5: flat clock-tree inserted design;
Stage 6: final placed and routed flat design.

This flow may be different at another design house.

For each circuit transformation, conventional equivalence checking tools are used to verify the functional equivalence of each pre-transformation version versus the post-transformation version (two designs as successive stages). It is common that the amount of resources (computer time and memory) used to perform this verification is correlated with the degree of difference between the two circuit models being compared. Checking the first RTL circuit model against the final gate-level circuit model is much harder than checking any pair of successive circuit models in the transformation chain. To reduce the resource cost, the conventional methodology is to only compare successive circuit models. However, this introduces a large possibility of errors, because the human user is responsible for managing the various versions, ensuring that no check in the chain was missed, and ensuring that each comparison turns out to be positive. A method for efficiently determining the equivalence between the first RTL circuit model and any derived gate-level version is highly desirable.

In conventional circuit verification, equivalence checking of two circuits is performed by (1) partitioning the two circuits into corresponding combinational subcircuit pairs that contain no storage elements, and (2) combinationally verifying the equivalence of each corresponding subcircuit pair. The circuits are partitioned at circuit inputs, outputs and storage element boundaries. The combinational subcircuit pairs are associated according to a correspondence between the circuit inputs, outputs and storage elements of the two circuits, so that the equivalence is verified for each corresponding set of subcircuits. The conventional device can create the circuit input, output and storage element correspondence with user guidance or automatically—see, e.g., U.S. Pat. No. 5,638,381 to Cho et al. ("the Cho patent"), U.S. Pat. No. 5,949,691 to Kurosaka et al. ("the Kurosaka patent") and Foster, "Techniques for Higher-Performance Boolean Equivalence Verification", Hewlett-Packard Journal 30–38 (August 1998).

FIG. 1 shows a conventional system for doing equivalence checking as disclosed by, e.g., the Kurosaka patent. The conventional system reads the circuit data of the two circuits to be compared. It then detects corresponding storage elements in the two circuits. Following this, based on the corresponding storage elements in the two circuits, the circuits are partitioned into many smaller purely combinational portions. The system then has to check each pair of corresponding points and report the results.

More specifically, FIG. 1 describes a conventional system for verifying the equivalence of two circuits. The system reads the circuit data for the two circuits in Step 101. Circuit representation techniques will be readily apparent to those skilled in the art; such techniques may involve converting high-level RTL circuits into an interconnection of gates and registers.

Next, in Step 102 the mapping points, i.e., sequential elements connected to one another by combinational subcircuits, are detected in each of the two circuits by scanning the circuit description. These points include sequential elements such as registers and latches as well as tri-state elements (tri-state elements are not conventionally considered sequential elements; however, they are usually included here in prior art systems because they are easier to handle this way). The mapping points in the two circuits are matched with each other in Step 103 using techniques known in the art—see, e.g., the aforementioned Cho and Kurosawa patents. This mapping and matching reduces the general problem of equivalence checking of sequential circuits to the problem of checking the equivalence of pairs of combinational subcircuits. Typically, no manipulation of the sequential elements is done, so no equivalence checking is implemented for those elements.

The circuits are partitioned into such subcircuits in Step 104 by dividing them at the mapping points. Next, in Step 105 the pairs of combinational subcircuits are checked using conventional methods such as those described in U.S. Pat. No. 5,754,454 to Pixley et al. ("the Pixley patent"). Once the comparison is done, the results are written out or reported to the user in Step 106.

FIG. 2 describes in more detail the conventional method for comparing two combinational subcircuits represented by Step 105 in FIG. 1. This method is similar to those described in C. A. J. van Eijk, "Formal Methods for the Verification of Digital Circuits", Ph.D. thesis, Eindhoven Institute of Technology, Eindhoven, Netherlands (1997) ("the van Eijk thesis") or the Pixley patent. First, random simulation (applying randomly-chosen test vectors to the two subcircuits) is run on the two subcircuits in Step 202. Simulation identifies cutpoint pair candidates; i.e., each pair of nets that has the same simulation signature forms a cutpoint pair. The more random simulation vectors chosen, the higher the probability that cutpoint pair candidate passed to the next section actually are cutpoint pairs. These cutpoint pair candidates are assembled into a list for further processing as described below.

If in Step 203 any output pair is determined not to be a cutpoint pair candidate, the system declares nonequivalence based on the simulation signature (two circuits cannot be equivalent if any pair of outputs is not equivalent). Otherwise, in Step 204 a cutpoint pair candidate is selected from the cutpoint pair list. Preferably, this is the candidate closest to the inputs of one or both of the circuits. Although Step 203 might be placed outside the loop bounded by Steps 218 and 216, including it in the loop results in only a minor increase in processor load and allows the routine to jump out of the loop when a pair of subcircuits is discovered to be nonequivalent, rather than running through the whole loop before making the determination.

Using previously gained knowledge of other cutpoints, the combinational equivalence checking engine determines if the pair is equivalent or not in Step 206. Any conventional equivalence checking engine such as the one described in the van Eijk thesis, the Pixley patent or J. R. Burch et al., "Tight Integration of Combinational Verification Methods", International Conference on Computer-Aided Design (1998) pp. 570–576 ("the Burch paper"), can be used here. Such engines may use many different methods, such as binary decision diagrams (BDDs), automatic test pattern generation (ATPG), satisfiability solvers (SAT), or a combination of these methods.

If at Step 208 the engine determines that the subcircuits are equivalent, it proceeds to see if the cutpoint pair is an output pair in Step 210. If so and Step 212 determines that all outputs have been verified, the job is done and the engine reports equivalence in Step 215. If, on the other hand, Step 210 determines that the candidate is not an output pair or Step 212 determines that all outputs have not been verified, the pair is designated as a real cutpoint pair in Step 214, another potential cutpoint pair is chosen in Step 204, and the cycle is repeated.

On the other hand, if the result of the equivalence check in Step 208 indicates that the pair is not equivalent, and the candidate pair is determined not to be the output pair in Step 216, the subcircuits are determined not to be equivalent (as above, two circuits cannot be equivalent if their outputs are not equivalent) and the test vector which showed the nonequivalence as determined by, e.g., techniques disclosed in the van Eijk thesis or Burch paper is used to refine the cutpoint pair candidates in Step 218 by, e.g., forming groups of subcircuits according to their responses to the simulation vectors.

SUMMARY OF THE INVENTION

The present invention has been made with the above shortcomings of the prior art in mind, and it is an object of the present invention to provide an equivalence checking tool that can compare a first RTL circuit model against any gate-level model, while not using resources comparable to those a conventional tool would require.

It is another object of the present invention to provide an equivalence checking tool that allows the first RTL to any gate-level version check to run many orders of magnitude faster than a conventional tool would run.

It is a further object of the present invention to provide a practical method for using information discovered from previous equivalence checks in an equivalence checking tool in order to reduce the resources required to perform subsequent equivalence checks.

It is still another object of the present invention to provide an equivalence checking tool that allows a designer to compare the latest version of the gate-level circuit with the RTL circuit, using resources comparable to those used in checking two subsequent versions of the gate-level circuit.

It is yet a further object of the present invention to provide a method for efficiently determining the equivalence between a first RTL circuit model and any derived gate-level version.

It is another object of the present invention to provide an equivalence verification checking system which caches equivalence information for future comparisons.

These and other objects are achieved according to an aspect of the present invention by providing a system and method that determines whether two circuit models have equivalent functionality. The method allows very fast comparison between two circuits taking advantage of previous work done. Whenever the system solves a problem, it stores information that it learned during the solution of the problem in a database. If the apparatus is presented with a new problem of determining equivalence between two portions of two circuits, it checks to see whether it has seen subcircuits similar to either of the two pieces before. If it has, it uses the knowledge cached during the previous checks to make the new check easier. As noted above, checking the equivalence of two circuit models involves checking equivalence of many pairs of sub-parts. Even when the subsequent comparisons involve different circuits, it is possible to take advantage of the information acquired during previous equivalence checks.

More specifically, when the present invention does a comparison, it caches the knowledge about the circuits in a persistent database (typically a computer disk). If, in a later comparison, one of the subcircuits is similar to one seen before, the apparatus may choose to extract an equivalent subcircuit from the disk and compare the second subcircuit against the extracted one, instead of comparing the second subcircuit against the first one. This can improve the performance dramatically since the comparison between the first and second subcircuits could take a long time (such as many hours or days), whereas the comparison between the extracted subcircuit and the second subcircuit may run in a few seconds or minutes.

BRIEF DESCRIPTION OF THE DRAWINGS

These and other objects, features and advantages of the present invention are better understood by reading the following detailed description of the preferred embodiment, taken in conjunction with the accompanying drawings, in which:

FIG. 10 shows another combinational check presented to the engine in the preferred embodiment;

FIG. 13 shows comparison of two subcircuits subsequent to the comparison in FIG. 12;

DETAILED DESCRIPTION OF PRESENTLY PREFERRED EXEMPLARY EMBODIMENTS

The present invention relates to a large flow system where a system such as that described by Kurosaka et al. is used multiple times on many different pairs of circuits, usually all different versions of the same circuit. The present invention provides a method to learn knowledge from the comparison of one portion, to cache this knowledge in memory, and to reuse this information in a later run.

The preferred embodiment uses three different attribute table data structures, all implemented using hash tables. The three tables are a numbering table used to obtain a unique number for any gate output; an Equivalence table used to store previously-discovered equivalencies between pairs of circuit portions; and a Vector table used to store useful test vectors for circuit portions with input names.

The Equivalence and Vector tables are used to store and access cached information learned from previous comparisons. One class of learning is storing the equivalencies learned in the Equivalence table. For each net (wire or, equivalently, gate output) in either circuit, the Equivalence table stores all the other nets it has previously been shown to be equal to. Suppose two intermediate nets are found equivalent, and we want to store the result in the Equivalence table. Each of these two signals has two numbers assigned thereto—a Named number and a Structure number. The engine creates two associations—one based on the Structure number of each subcircuit, and one based on the Named number of each subcircuit, and stores both associations in a Numbering table.

Another class of learning is all test vectors used to show the nonequivalence of two signals. During the comparison check between two circuit portions, test vectors are discovered that show nonequivalence between two intermediate signals—see, e.g., the van Eijk thesis. Whenever such a test vector is discovered, it is stored in the Vector table. Such vectors are stored per signal, for the signal in each circuit. As an example, consider the circuits in FIG. 9. If during the comparison check, the system determines that the signals 9 and 15 are nonequivalent because of the input vector (net 1=1, net 2=0) where net 1 and net 2 are inputs a and b, respectively, this vector is associated with each of the two numbers 9 and 15, and these associations are stored in the Vector table as shown in TABLE IV.

Figure 3:
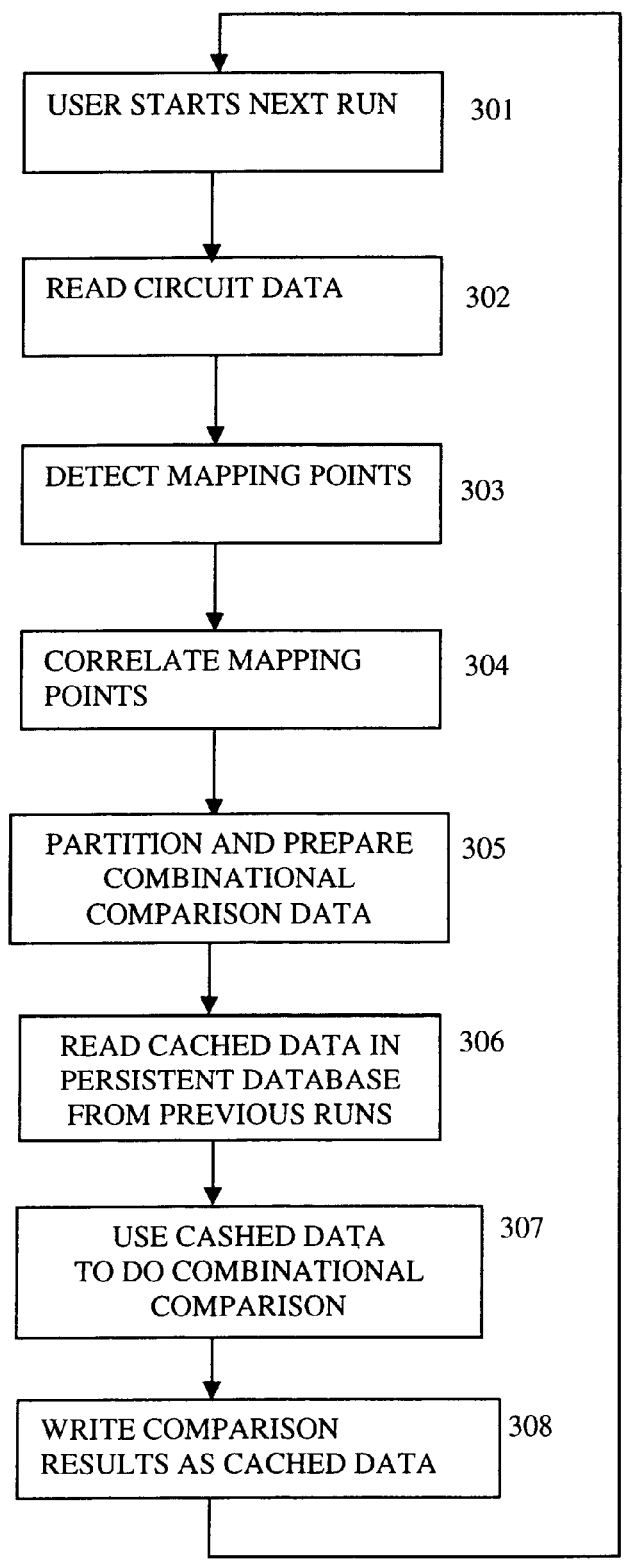
FIG. 3 shows an equivalence checking method according to a preferred embodiment of the present invention.

FIG. 3 shows a preferred embodiment of the present invention which, as noted above, uses a persistent database to cache this comparison knowledge. This embodiment bears some resemblance to the conventional method shown in FIG. 1. That is, after starting the process in Step 301 the system of FIG. 3 reads the circuit data in Step 302. Next, in Step 303 the mapping points are detected in each of the two circuits. The mapping points in the two circuits are matched with each other in Step 304 as known in the art. The circuits are partitioned into such subcircuits in Step 305.

Figure 1:
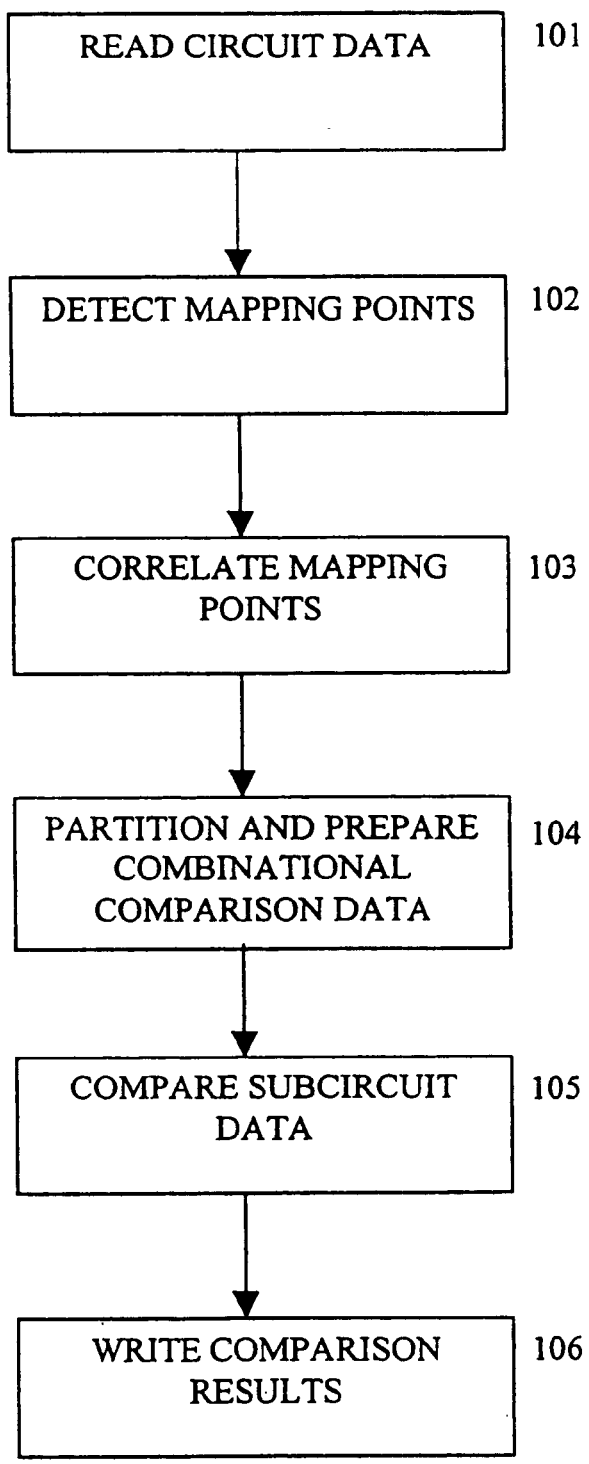
FIG. 1 describes an equivalence checking method implemented by a conventional system.

Next, however, unlike the conventional method of FIG. 1, in Step 306 of the preferred embodiment the database cache containing the Numbering, Equivalence and Vector tables is read to obtain previous checking results. The combinational comparison of Step 307 uses the cached data to make the combinational checks much simpler. While the comparison is done, results are collected and are eventually written back to the cache in Step 308. At some point, checks of all desired stages will be done and the engine will report whether the two circuits were found to be equivalent or not equivalent.

In a preferred embodiment of the present invention, two circuits under consideration are each represented as non-cyclic interconnections of Boolean gates such as AND gates, OR gates, NOT gates, etc. as will be apparent to those skilled in the art. The invention is not so limited, however, and other standard components such as a MULTIPLIER, ADDER, MULTIPLEXER and the like may be used in conjunction with or in addition to the above elements. In addition, each input circuit is also associated with its stage number in the design flow. This associated stage number can either be determined automatically or be user-specified. As described earlier, this stage number identifies the stage of the design flow the circuit belongs to, e.g., whether the circuit comes from a hierarchical RTL design stage, a flat scan-inserted gate-level stage, etc.

Figure 4:
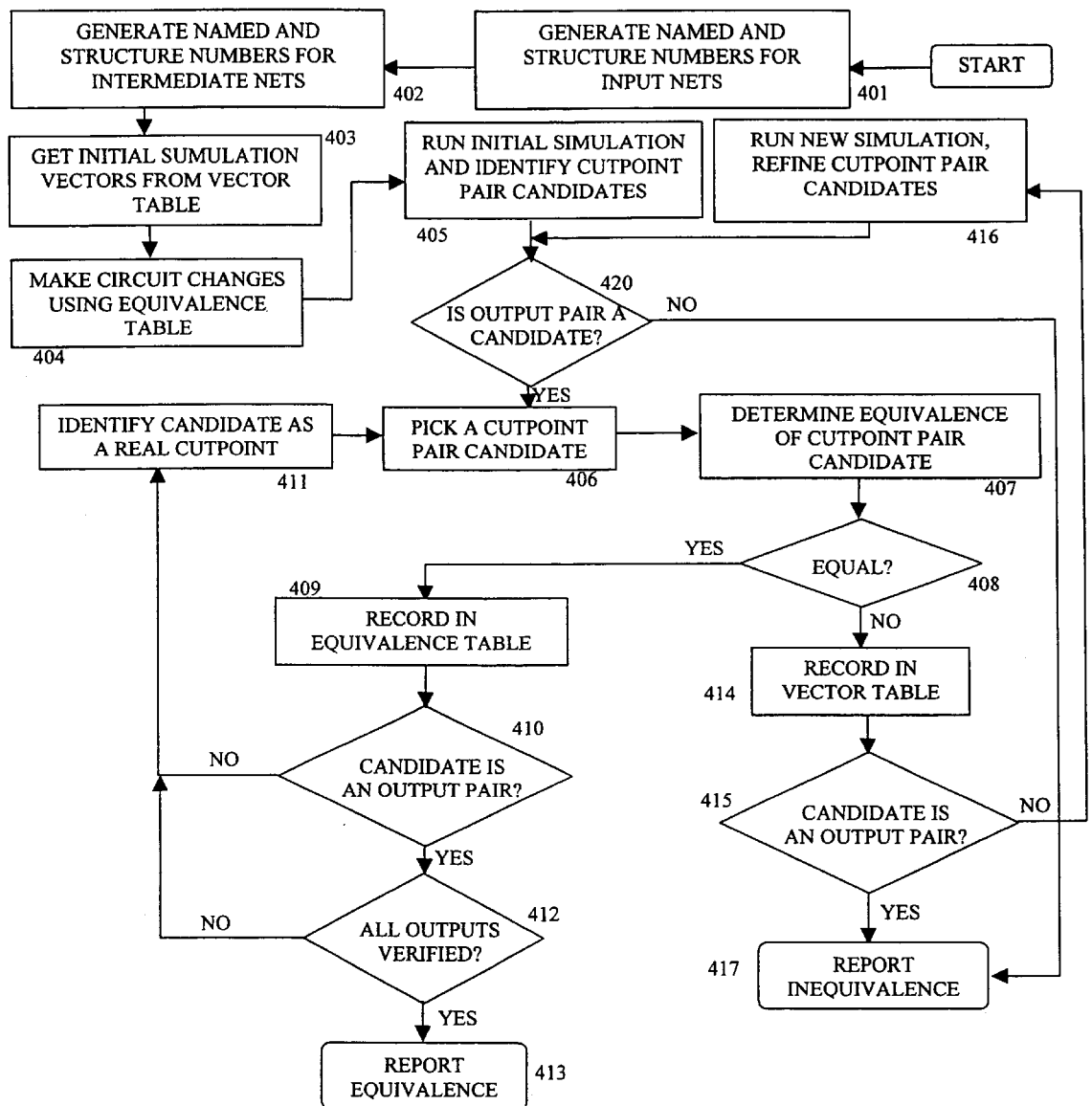
FIG. 4 shows a technique for verifying the combinational checks generated during the equivalence checking in FIG. 3.
Figure 5:
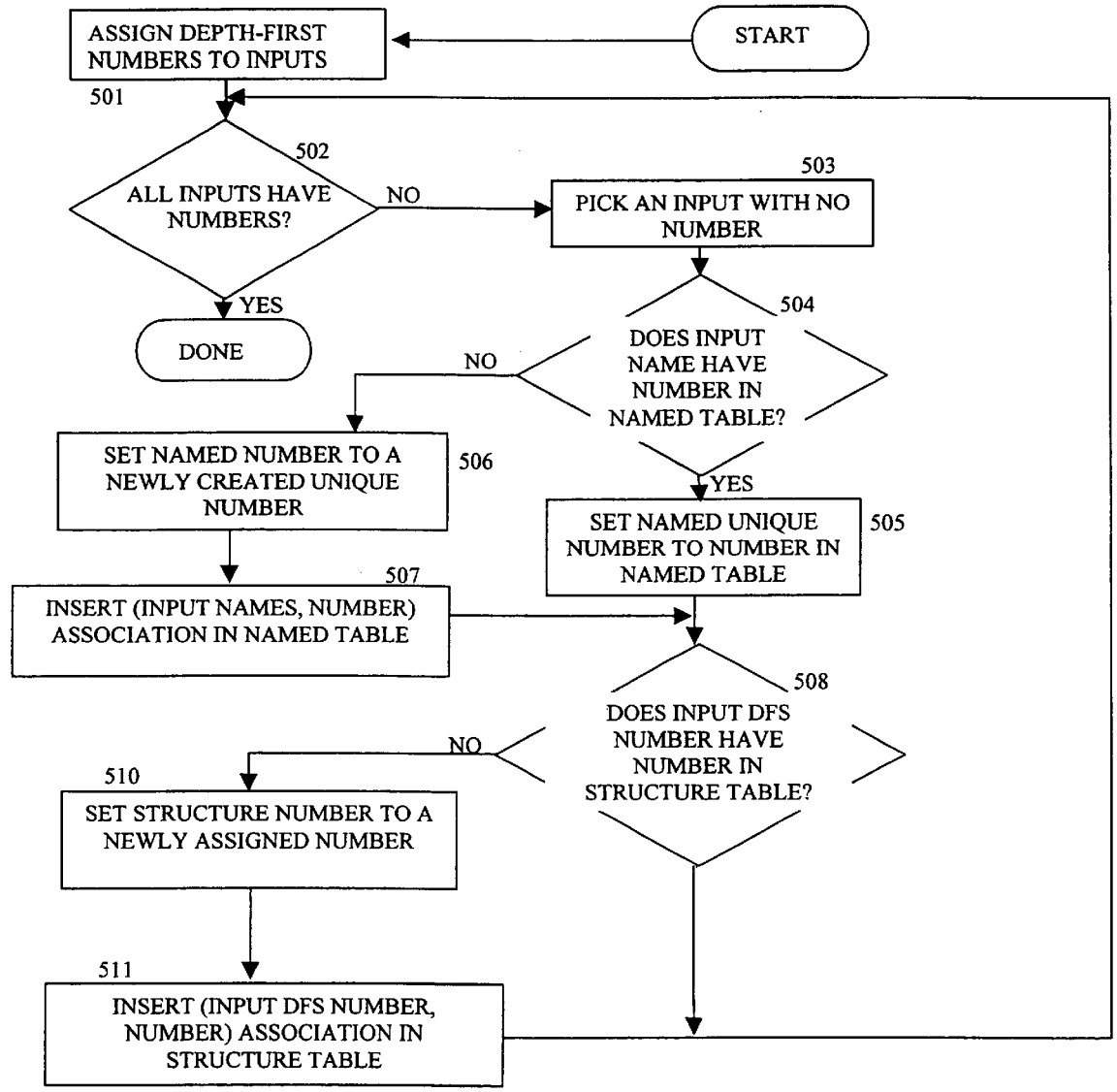
FIG. 5 shows in greater detail a method for generating a numbering table of input nets, as denoted by Step 401 in FIG. 4.

FIG. 4 shows details of subcircuit comparison using cached data, corresponding to Step 307 in FIG. 3. First, in Step 401 the system generates Named and Structure numbers for inputs of the subcircuits. FIG. 5, depicting Step 401 in greater detail, shows this process. First, in Step 501 one circuit in the combinational output circuit pair is traversed in depth-first order from the outputs to the inputs, and each distinct input is assigned an Assignment number based on the order in which the input was visited. Each corresponding input in the other circuit of the pair is assigned the same Assignment number. Once this process is complete, a depth-first search is performed on the other circuit to pick up any inputs therein which do not have a counterpart in the first circuit. For example, suppose the first circuit has four inputs a, b, c and d, while the second circuit has five inputs a, b, d, e and f. A depth-first search using the first circuit would assign Assignment numbers 1, 2, 3 and 4 respectively to inputs a, b, c and d but would leave inputs e and f in the second circuit unassigned. The second depth-first search based on the second circuit would assign Assignment numbers 5 and 6 to those inputs.

Each input will now be assigned two numbers in the Numbering table—a Named number and a Structure number. The preferred embodiment has only these two types of numbers; however, the invention actually allows for many possible numbers. For example, another embodiment could use, in addition to or in substitution for the Named number or Structure number, numbers assigned according to a breadth-first search of circuit inputs. Moreover, the preferred embodiment need use only one type of numbering. Other possibilities will be readily apparent to those skilled in the art.

At this point, all inputs in both circuits under comparison should have Assignment numbers assigned to them. Then, in the remainder of the process shown in FIG. 5, the engine assigns Named and Structure numbers to the inputs and makes corresponding records in the Numbering table. More specifically, each input net in the circuits under comparison can be represented by two different unique numbers, a Named number and a Structure number. Each Named number is associated with the name of the input net, and each Structure number is associated with the structural position of the input in the circuit being analyzed, for example, the Assignment number of the input. The two sets of numbers are distinct. Both inputs in each pair of corresponding inputs from the two circuits are given the same number.

Referring now to FIG. 5, if the system determines in Step 502 that all inputs have unique numbers, i.e., Named and Structure numbers, in the Numbering table, the input numbering process is over; if not, the system chooses an input without Named and Structure numbers in Step 503 and checks to see if its input name has a Named number (assigned, for example, by an earlier check) associated with it in the Named table in Step 504. If so, Step 505 sets the named unique number to the number in the Numbering table. If not, a new Named number is generated in Step 506 and its association with the input is stored in the Numbering table in Step 507.

Execution proceeds to Step 508. Similarly to the above, Step 508 determines whether the chosen input's Assignment number has a Structure number associated with it. If not, a new Structure number is generated in Step 510 and associated with the Assignment number in the Numbering table in Step 511.

The above process completes the assignment of Named and Structure numbers to one input in the circuit pair under comparison. Execution then returns to Step 502 to pick up another unassigned input.

Figure 6:
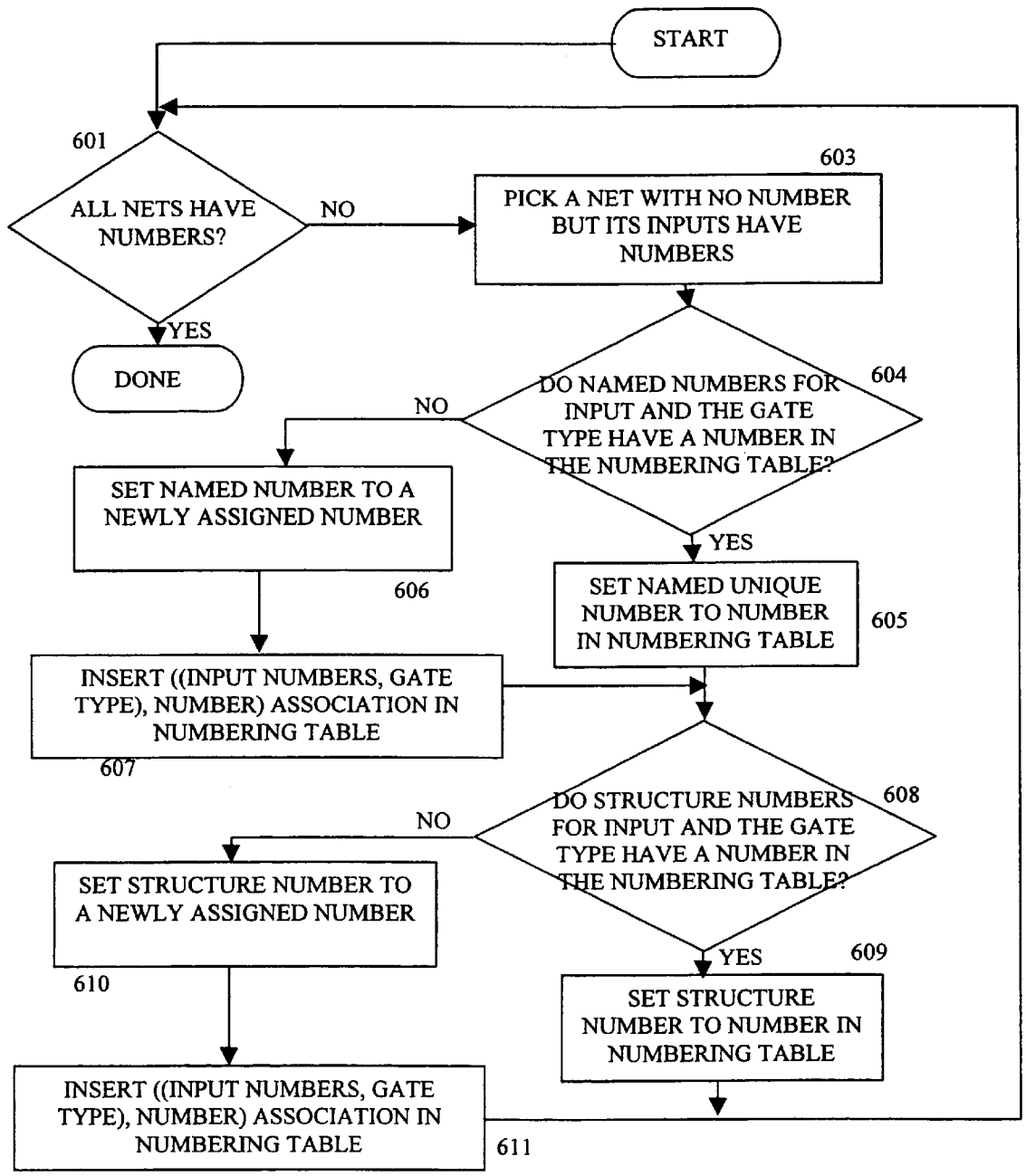
FIG. 6 shows in greater detail a method to generate a numbering table of intermediate nets, as denoted by Step 402 in FIG. 4.

At some point all inputs have been assigned Named and Structure numbers. Once happens, the intermediate nets, i.e., the rest of the nets (wires or, equivalently, the gates having outputs connected to those wires) in the circuits, are assigned Named and Structure numbers. This is described in FIG. 6, which corresponds to step 402 in FIG. 4. Here, if the system determines in Step 601 that all intermediate nets have Named and Structure numbers in the Numbering table, the net numbering process is over; if not, the system chooses a net without Named and Structure numbers but the inputs to whose gates have been assigned Named and Structure numbers in Step 603 and checks to see if the Named numbers for the net's inputs and gate type have numbers in the Numbering table in Step 604. If so, in Step 605 the net output is assigned as described above in connection with Step 505.

The Numbering table makes sure that if inputs of two different gates are of the same type (AND, OR, etc) and have the same Named pairs of numbers as inputs, the two gate outputs are each represented by the same Named number; a similar property holds for Structure numbers. The first time the system sees a gate with previously unseen numbers on that gate type, the system assigns an unused number to its output in Step 606 and stores the association in the Numbering table in Step 607. The next time the system sees a gate of the same type and with the same input signals in Step 604, the system checks the Numbering table and returns the previously allocated number in. Step 605 for assignment to the circuit.

In either case, execution proceeds to Step 608. Similarly to the above, Step 608 determines whether the chosen net's Structure numbers for the input and the gate type have a number in the Numbering table. If not, a new Structure number is generated in Step 610 and associated with the input numbers and gate type in the Numbering table in Step 611. The next time the engine sees a gate of the same type and with the same input signals in Step 608, it will check the Numbering table and return the associated Structure number in Step 609.

Figure 9:
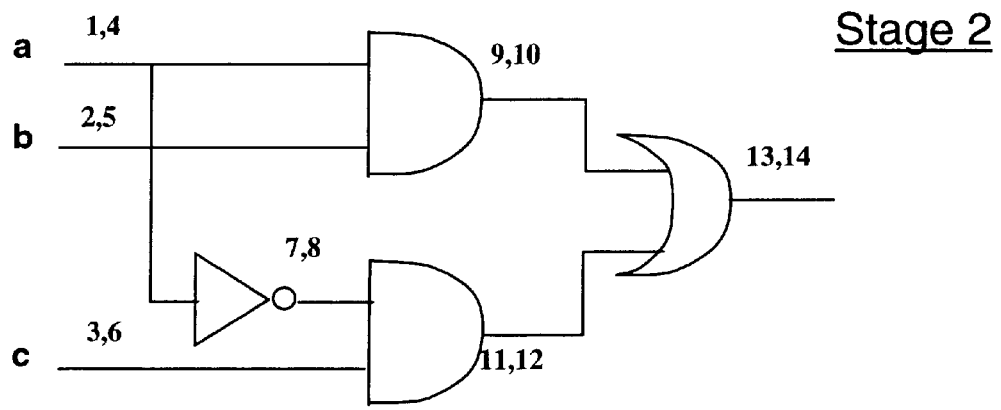
FIG. 9 shows an example of two combinational circuits that are to be compared, as denoted by Step 307 in FIG. 3.
Figure 9:
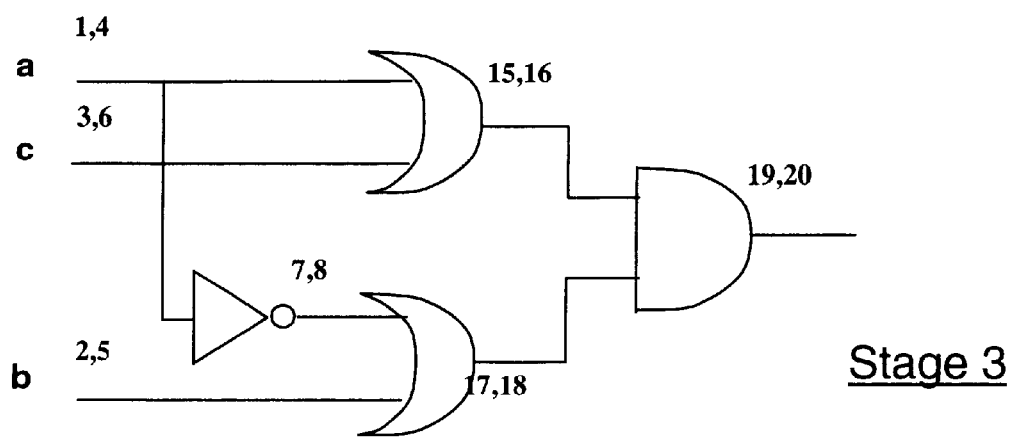

FIG. 9 shows an example of two combinational circuits that are to be compared in Step 307 from FIG. 3. The nets of these circuits have Named and Structure numbers, assigned as described above in connection with FIGS. 5 and 6. FIG. 9 shows the Named and Structure numbers for all the nets. The Named numbers for the three inputs a, b, and c are 1, 2, and 3, respectively; similarly, the Structure numbers are 4, 5, and 6 respectively. When the Numbering table is invoked to return a Named number for the NOT gate in the top circuit, it returns a new number 7 because a NOT gate for input 1 has not been seen before; later, when the Numbering table is invoked for the Named number of the NOT gate in the lower circuit, it again returns a 7 since a NOT gate of 1 was seen before, and the returned number was 7. In contrast, when the Numbering table is invoked for the Structure number for the first OR gate in the lower circuit, a new number 16 is returned because this is the first time the OR of 4 and 6 has been seen.

TABLE I shows the remaining assigned numbers for the intermediate nets.

TABLE I

| Gate | Number | Gate | Number |
| --- | --- | --- | --- |
| NOT, 1 | 7 | OR, 10, 12 | 14 |
| NOT, 4 | 8 | OR, 1, 3 | 15 |
| AND, 1, 2 | 9 | OR, 4, 6 | 16 |
| AND, 4, 5 | 10 | OR, 7, 2 | 17 |
| AND, 7, 3 | 11 | OR, 8, 5 | 18 |
| AND, 8, 6 | 12 | AND, 15, 17 | 19 |
| OR, 9, 11 | 13 | AND, 16, 18 | 20 |

Figure 8:
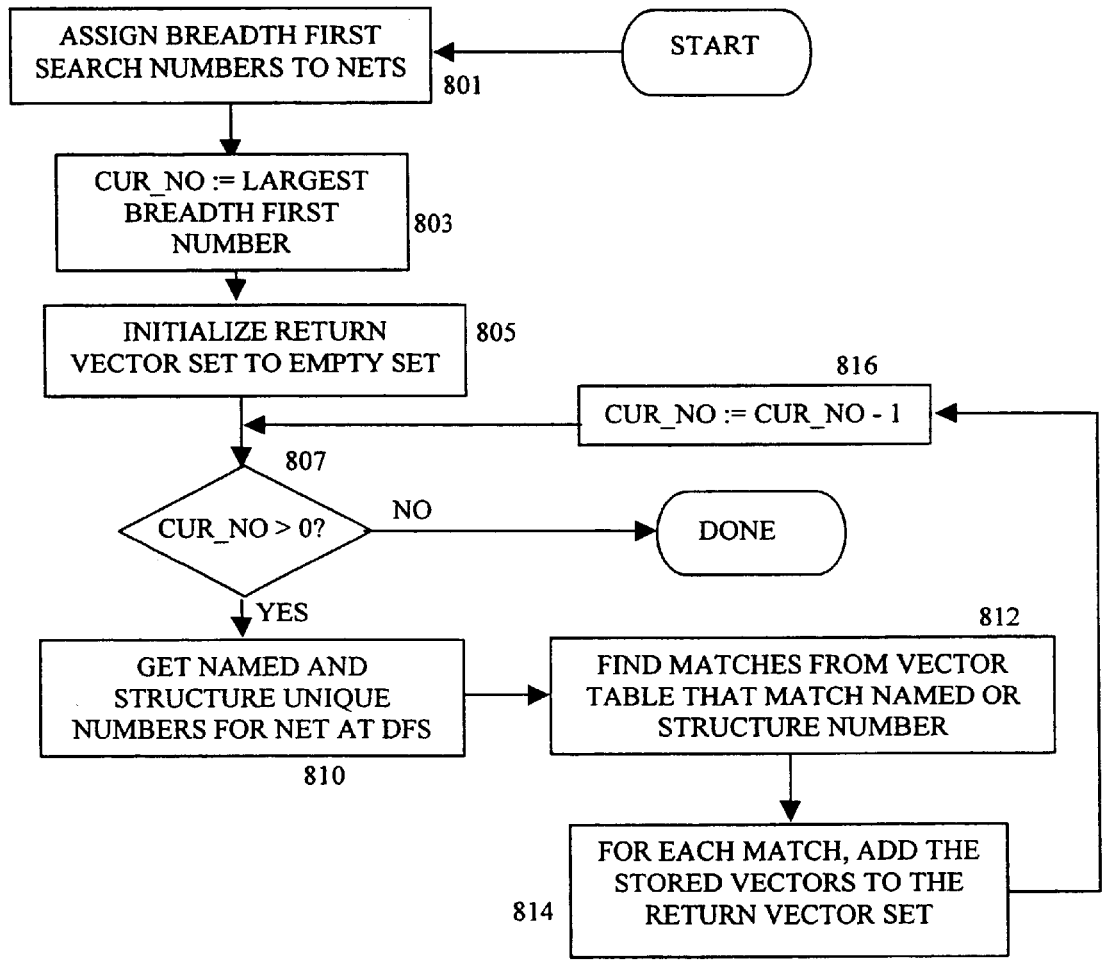
FIG. 8 shows how data from a Vector table is used to generate simulation vectors, as denoted by Step 403 in FIG. 4.

Referring again to FIG. 4, after assigning Named and Structure numbers to the inputs and intermediate nets of the circuit pair, initial simulation vectors are obtained from the Vector table in Step 403. FIG. 8 describes how the Vector table, stored as part of the cache, is used to generate new test vectors for simulation. In breadth-first order, the engine searches the circuits starting from their outputs going towards their inputs in Step 801 and assigns breadth-first search numbers to the intermediate nets (almost any assignment system that results in the processing of nets closer to the output before nets closer to the input will be a preferable searching/numbering technique). The engine indexes through the breadth-first numbered nets in decreasing order and, for every net the engine sees as directed by a loop initialized in Steps 803 and 805 and established in Steps 807 and 816, fetches the Named and Structure numbers for the net from the Numbering table in Step 810. The engine retrieves all the vectors from the Vector table matching either the Named or Structure numbers for this net in Step 812. Each such matched vector is added to the set of simulation vectors in the Vector table in Step 814 and the process continues with the next net via Steps 816 and 807.

Figure 7:
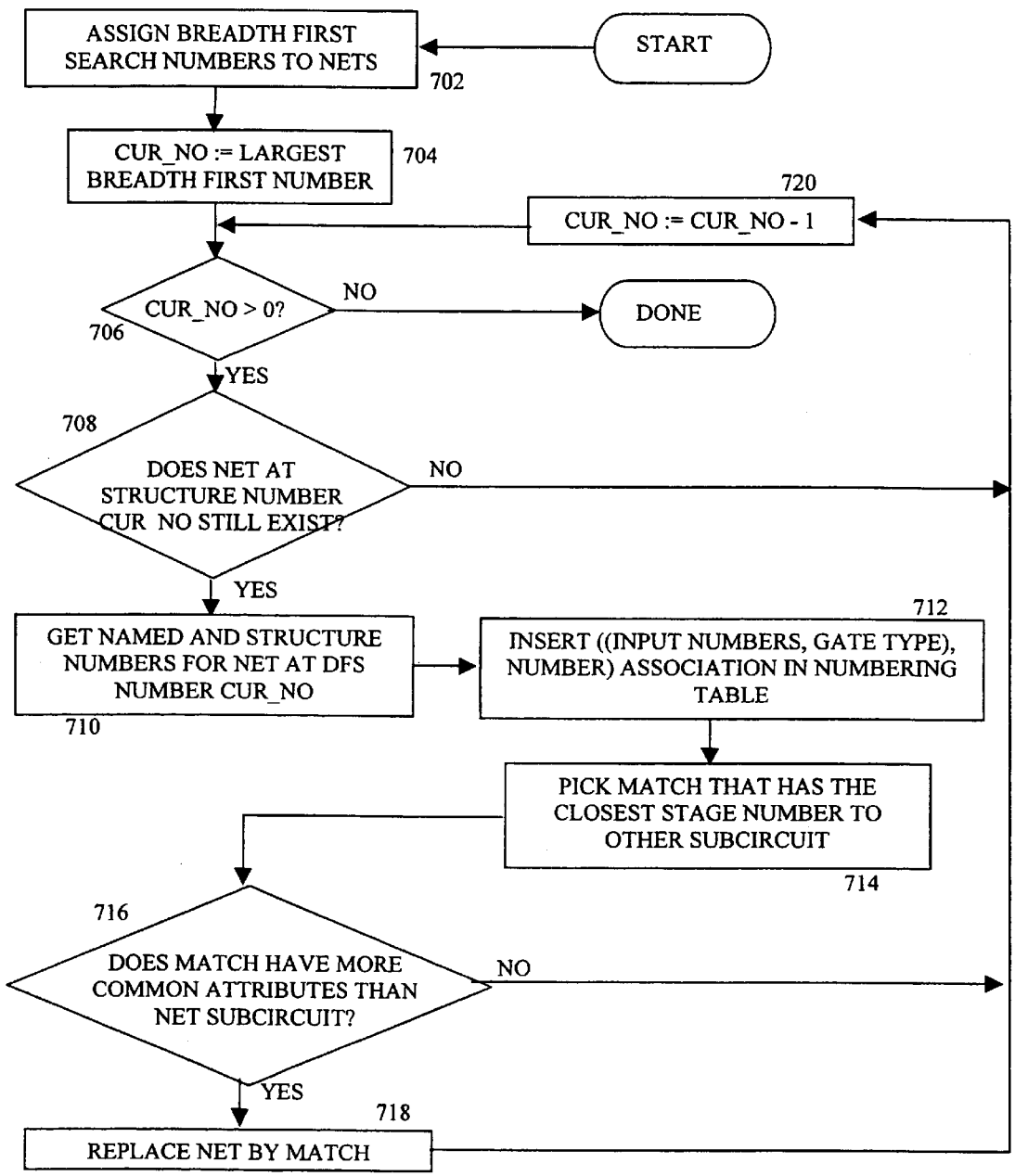
FIG. 7 shows how data from an Equivalence table is used to make circuit replacements, as denoted by Step 404 in FIG. 4.

Referring again to FIG. 4, after getting initial simulation vectors in Step 403, the engine makes circuit changes using the Equivalence table in Step 404. FIG. 7 provides a more detailed view of Step 404. In breadth-first order, the engine starts from outputs going towards inputs in one of the circuits and assigns breadth-first numbers to the nets in Step 702. For every candidate net that the engine sees as directed by a decreasing loop initialized in Step 704 and established by Steps 706 and 720, it checks to see if the net still exists, i.e., it hasn't been replaced by some other net, in Step 708 and fetches the Named and Structure numbers for the net in Step 710. If either of the Named and Structure numbers has a match in the cached Equivalence table, the engine retrieves all Equivalence table entries matching either the Named number or the Structure number in Step 712. It then replaces the net by one of these matching nets in Step 718.

In the preferred embodiment, in Step 716 the engine picks a replacement that belongs to a design stage closest to the other circuit (recall that the design stages indicate whether the circuit is from a hierarchical RTL stage, a scan-inserted gate-level stage, a placed and routed gate-level stage, etc.); if no matched net is closer than the currently-used net, no replacement is made in Step 716. In either case, the process loops back and selects the next net in decreasing breadth-first order for possible replacement.

To elaborate on the above, given an existing special netlist and another set of netlists, each with a stage tag, it is preferable to pick the netlist from the set which has a stage tag which is closest to the special netlist. For example, suppose one of the circuits in the pair under consideration is a special netlist S that is a hierarchical synthesis gate-level and thus has a tag of Stage 2. Further suppose that there are three netlists in the set: netlist A that is hierarchical RTL (Stage 1), netlist B that is hierarchical synthesized gate-level (Stage 2) and netlist C that is a flat final placed and routed gate-level circuit (Stage tag 6). The netlist that has a stage tag closest to S is netlist B and would preferably be selected.

Figure 2:
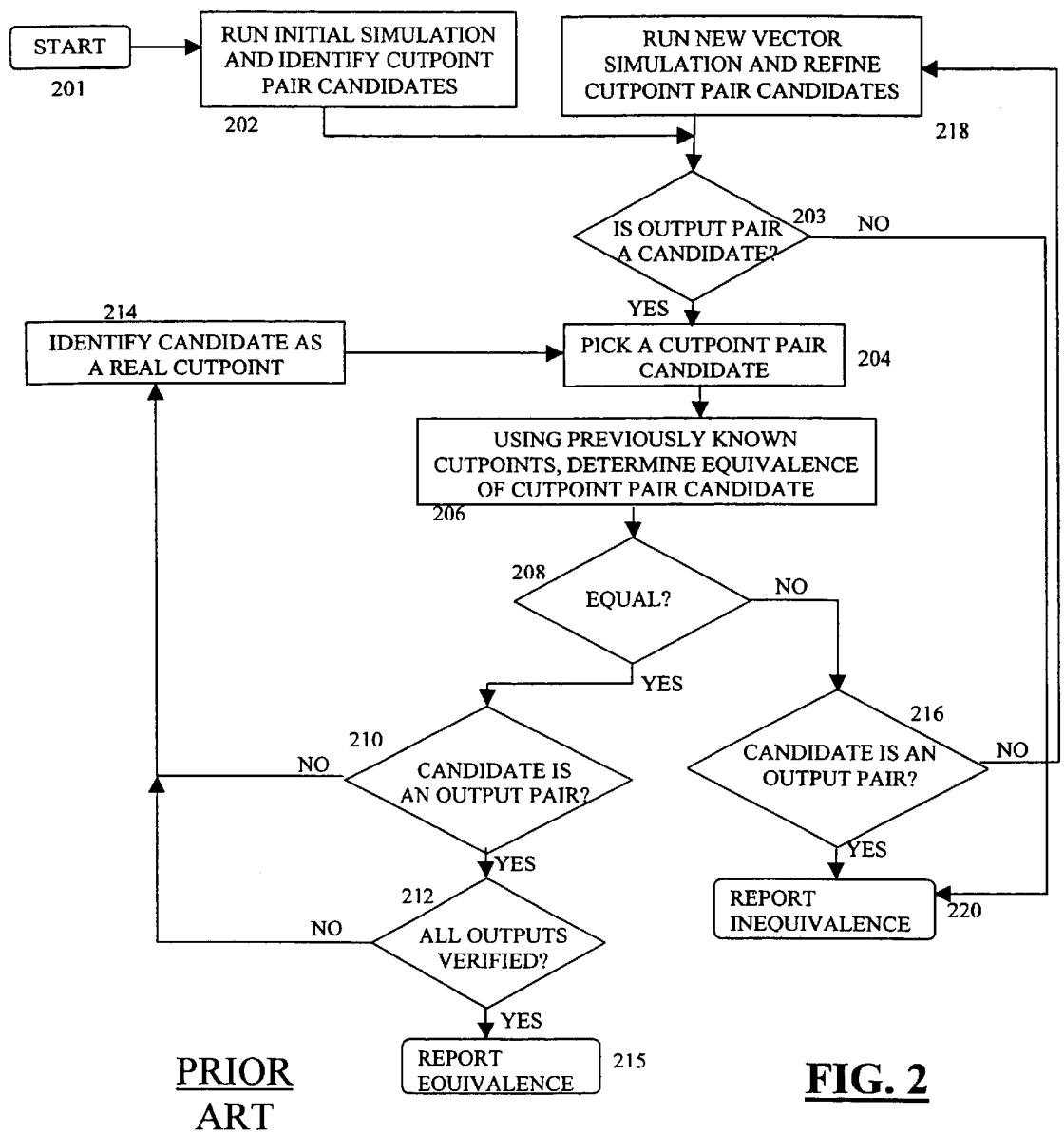
FIG. 2 shows a conventional technique for verifying the combinational checks generated during the equivalence checking in FIG. 1.

Once new simulation vectors are derived in Step 403 using breadth-first numbering and the stored Vector table in the cache, and portions of the combinational subcircuits are replaced using the breadth-first numbering and the Equivalence table in Step 404, the procedure for picking cutpoint pair candidates and comparing them is similar to the conventional method of FIG. 2. First, simulation is run on the two subcircuits in Step 405. Here, however, unlike the prior art method of FIG. 2, the initial simulation vectors selected in Step 403 are used rather than a random population.

Next, if in Step 420 the output pair is determined not to be a cutpoint pair candidate, the system declares nonequivalence based on the simulation signature in Step 417; otherwise, in Step 406 a cutpoint pair candidate is selected from the cutpoint pair list and the combinational equivalence checking engine determines if the pair is equivalent or not in Step 407. TABLE II shows checks generated during the check of the example circuits of FIG. 9 in Step 407.

TABLE II

| Equivalence Check | Result | Counterexample Vector |
| --- | --- | --- |
| (9, 10) vs (15, 16) | Nonequivalent | (1, 4) = 1 and (2, 5) = 0 |
| (13, 14) vs. (19, 20) | Equivalent | |

If at Step 408 the engine determines that the subcircuits are equivalent, it adds a record reflecting this fact to the Equivalence table in Step 409 and moves to Step 410. Specifically, two matches are inserted in the Equivalence table; the engine records the Named numbers for the two Equivalence numbers tagged with their stage numbers, and it records the Structure numbers for the two equivalent numbers tagged with their respective stage numbers in the Equivalence table (compare the prior art method of FIG. 2, which has no corresponding step) and proceeds to see if the cutpoint pair is an output pair in Step 410.

As an example, consider again the two circuits in FIG. 9. When the proposed system determines that the two output nets are equivalent, two associations are stored in the Equivalence table: 13 and 19 are equal, corresponding to the Named numbers; and 14 and 20 are equal, corresponding to the Structure numbers.

Returning to FIG. 4, if Step 410 determines that the candidate pair is an output pair and Step 412 determines that all outputs have been verified, the job is done and the engine reports equivalence in Step 413. If, on the other hand, Step 410 determines that the candidate pair is not an output pair or Step 412 determines that all outputs have not been verified, the pair is designated as a real cutpoint pair in Step 411, another potential cutpoint pair is chosen in Step 406, and the cycle is repeated.

If the result of the equivalence check in Step 408 indicates that the pair are not equivalent, a record reflecting this fact is added to the Vector table in Step 414 (again, the prior art method of FIG. 2 has no corresponding step). Specifically, the engine records four vectors in the Vector table—for each of the two Named numbers and the two Structure numbers, it associates the test vector with the number in the Vector table. Then, if the candidate pair is determined not to be the output pair in Step 415, the subcircuits are determined not to be equivalent and the test vector which showed the non-equivalence is used to refine the cutpoint pair candidates in Step 416.

Referring back to the example circuits of FIG. 9, for nodes that are proved equivalent, the results are stored in the Equivalence table in Step 409, as shown in TABLE III. For nodes that are proved nonequivalent, the vectors are stored in the Vector table in Step 414, as shown in TABLE IV.

TABLE III

| Net | Equivalent Nets |
|---|---|
| 13 | 19 |
| 19 | 13 |
| 14 | 20 |
| 20 | 14 |

TABLE IV

| Net | Vector |
|---|---|
| 9 | net 1 = 1, net 2 = 0 |
| 10 | net 4 = 1, net 5 = 0 |
| 15 | net 1 = 1, net 3 = 0 |
| 16 | net 4 = 1, net 6 = 0 |

Now it is possible to describe how the stored information in the cache is used by the system during the processing of a future circuit portion, either in the current invocation of the program or in a future invocation. When the combinational checker gets two circuit portions to compare, it first determines the Named and Structure numbers for all the nets in both circuits.

As an example, consider the combinational check for the circuits shown in FIG. 10, which is a possible check arising after the comparison discussed above and shown in FIG. 9. The Named and Structure numbers are shown in the Figure. Note that two inputs, a and c, are the same as the circuits in FIG. 9.

In addition, there is a new input d. The previously-seen inputs, a and c, get the same Named and Structure numbers. The new input d, gets a fresh Named number 21 because the name d was not seen earlier. For the Structure number, d gets the same number, 5, as the Structure number for b in FIG. 9, because d, like b, is second in the depth-first order. Notice that some other intermediate Named and Structure numbers are same as those in FIG. 9; this is because the number for the inputs of the gates are same as before. On the other hand, when gates on new numbers are seen, new numbers are created for the output of the gate; consider numbers 22 through 31 in FIG. 10.

The present invention allows later comparison checks to use cached knowledge from previous checks. For the comparison in FIG. 10, we assume that cached information from the check in FIG. 3 exists in the Vector and Equivalence tables. First, the engine checks for any matches in the Vector table, for any assigned number. If any match is found, the associated vector is used in the initial simulation vector selection of Step 403.

As an example, consider the new check in FIG. 10 that uses the Vector table generated for FIG. 9 as shown in TABLE IV. Here, net number 10 is associated with the vector (net 4=1, net 5=0); this results in a simulation with input a set to 1, and input d set to 0 because input a has a Structure number of 4 and input d has a Structure number of 5. Similarly, net 15 is associated with the vector (net 1=0, net 3=1), and this association results in a simulation with input a set to 1, since that input has a Named number of 1. Proceeding in this fashion, a set of simulation vectors can be built, and the cutpoint check procedure of FIG. 4 can be based thereon.

The preferred embodiment described above uses equivalence information derived from previous checks of sub-circuits, nets and the like; however, the invention is not so limited. For example, predetermined equivalence information may be used as well. For example, the embodiment may include equivalencies between an n×m bit multiplier circuit and a gate-level Booth multiplier circuit. Such possibilities will be readily apparent to those skilled in the art.

In addition to making use of the Vector table, as discussed above, the Equivalence table is also used for making use of previously learned information. When the system gets a new comparison, it checks the new net numbers in the Equivalence table. If any of the net numbers in either circuit matches, the engine fetches all matched numbers equivalent to it in the Equivalence table. Among these candidates, it picks one which has the best chance of closely matching the second circuit portion. As noted above, this selection is done based on the stage numbers of the fetched circuit and the second circuit. If the stage number for the best candidate is closer to the stage number of the second circuit than the first circuit, the engine replaces the first circuit with the selected portion. As an example, consider the comparison in FIG. 10 again. The previous comparison, done in FIG. 9, had generated the Equivalence table shown in TABLE III. There is only one net number in the current comparison, number 14, which has a match in the Equivalence table. This number is shown to be equivalent to number 20 in the Equivalence table.

Figure 11:
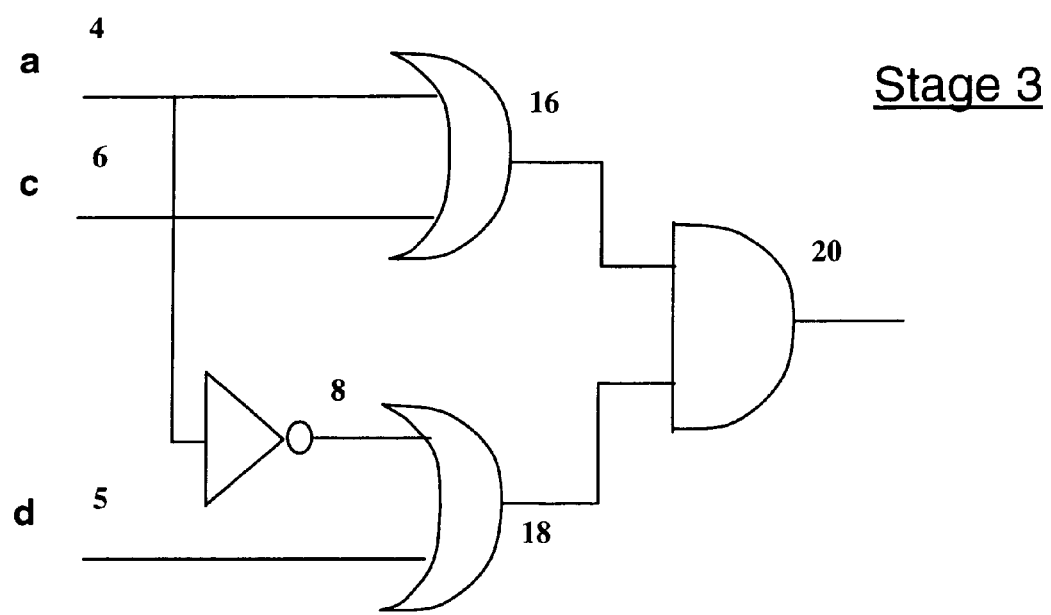
FIG. 11 shows a reconstructed circuit according to the preferred embodiment.

When the best candidate is selected, a circuit corresponding to the selected candidate is built using the Numbering table. In the current example, using information in the Numbering table the engine has decided to replace 14 by 20. The Numbering table is used to generate the circuit for the net numbered 20. Using the Numbering table shown in TABLE I, starting from the net numbered 20, going backwards, the engine builds the circuit. For example, the table states that net 20 is the AND of 16 and 18. When the input terminals are reached, the input terminals are assigned Named numbers based on the numbers already assigned for this comparison. The complete reconstructed circuit is shown in FIG. 11. At this point the circuit driving the original net labeled (23,14) is replaced with this new circuit, which is equivalent to the original net but is of an earlier stage. While this example only shows the reconstruction for the entire circuit, anyone skilled in the art can determine, extrapolating for this example, how subcircuits of the circuit can be replaced similarly.

Consider this operation in a larger context. FIG. 9 represents a comparison between two close stages in a design process—for example, Stage 2 and Stage 3. FIG. 10 shows a comparison between two later stages, e.g., Stage 2 and Stage 4. Using the preferred embodiment, it was possible to replace the top circuit in FIG. 10 by FIG. 11 to yield a comparison between FIG. 11, which looks like a circuit from Stage 3, and the bottom circuit in FIG. 10, which is a Stage 4 circuit. This yields a simpler comparison.

Note also that in this example, replacement was possible only through the use of Structure numbers. A system which used only Named numbers would not be able to help in this replacement. Those of ordinary skill in the art will be able to find examples in which the converse is true, i.e., the Named numbers work but the Structure numbers do not, and examples (see below) in which neither scheme works, but some other numbering system does.

Figure 12:
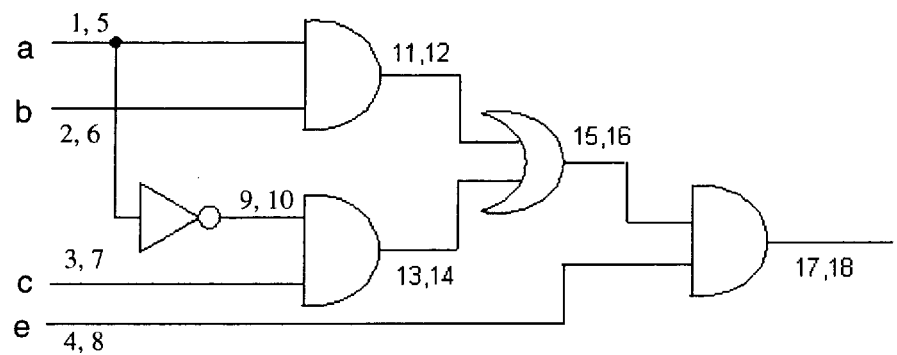
FIG. 12 shows a comparison of two subcircuits.
Figure 12:
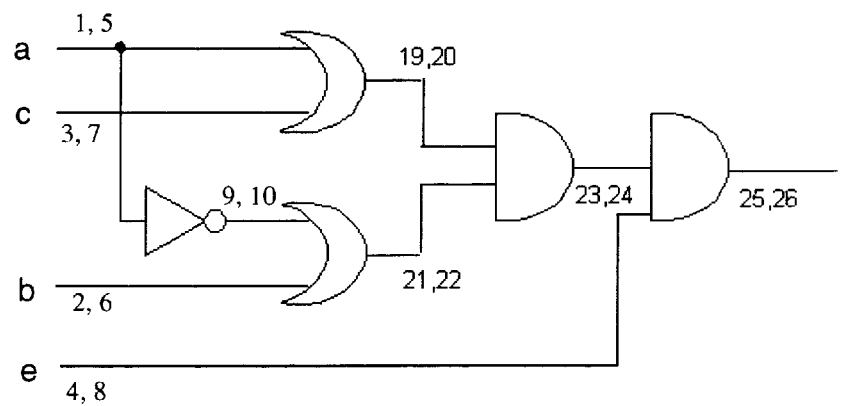

Consider now a second example shown in FIGS. 12–17. FIG. 12 shows the comparison of two circuits marked with stage tags 2 and 3, respectively. As can be seen, Named numbers for inputs a, c and e are 1, 3 and 4, respectively. Structure numbers for depth-first numbered inputs 1, 2, 3 and 4 are 5, 6, 7 and 8, respectively. The Numbering table arising from numbering of the intermediate nets is shown in TABLE V.

TABLE V

| Gate | Number | Gate | Number |
| --- | --- | --- | --- |
| NOT, 1 | 9 | AND, 16, 8 | 18 |
| NOT, 5 | 10 | OR, 1, 3 | 19 |
| AND, 1, 2 | 11 | OR, 5, 7 | 20 |
| AND, 5, 6 | 12 | OR, 9, 2 | 21 |
| AND, 9, 3 | 13 | OR, 10, 6 | 22 |
| AND, 10, 7 | 14 | AND, 19, 21 | 23 |
| OR, 11, 13 | 15 | AND, 20, 22 | 24 |
| OR, 12, 14 | 16 | AND, 4, 23 | 25 |
| AND, 15, 4 | 17 | AND, 8, 24 | 26 |

After verifying the two circuits in FIG. 12, the Vector and Equivalence tables take the forms shown in TABLEs VI and VII.

TABLE VI

| Net | Equivalent Nets |
| --- | --- |
| 15 | 23 |
| 23 | 15 |
| 16 | 24 |
| 24 | 16 |
| 17 | 25 |
| 25 | 17 |
| 18 | 26 |
| 26 | 18 |

TABLE VII

| Net | Vector |
| --- | --- |
| 11 | net 1 = 1, net 2 = 0 |
| 19 | net 1 = 1, net 2 = 0 |
| 12 | net 5 = 1, net 6 = 0 |

TABLE VII-continued

| Net | Vector |
| --- | --- |
| 20 | net 5 = 1, net 6 = 0 |

At a later time, suppose equivalence of the two circuits in FIG. 13, respectively having stage tags 2 and 4, is being checked. Following the numbering stage, the updated Named numbers for inputs a, c, e and d are 1, 3, 4 and 27, respectively. Structure numbers for depth-first numbered inputs 1, 27, 3 and 4 are 5, 6, 7 and 8, respectively. New additions to the Numbering table are shown in TABLE VIII.

TABLE VIII

| Gate | Number | Gate | Number |
| --- | --- | --- | --- |
| AND, 1, 27 | 28 | AND, 5, 33 | 35 |
| OR, 28, 13 | 29 | NOT, 34 | 36 |
| OR, 29, 4 | 30 | NOT, 35 | 37 |
| OR, 16, 8 | 31 | OR, 19, 36 | 38 |
| NOT, 27 | 32 | OR, 20, 37 | 39 |
| NOT, 6 | 33 | OR, 38, 4 | 40 |
| AND, 1, 32 | 34 | OR, 39, 8 | 41 |

Figure 14:
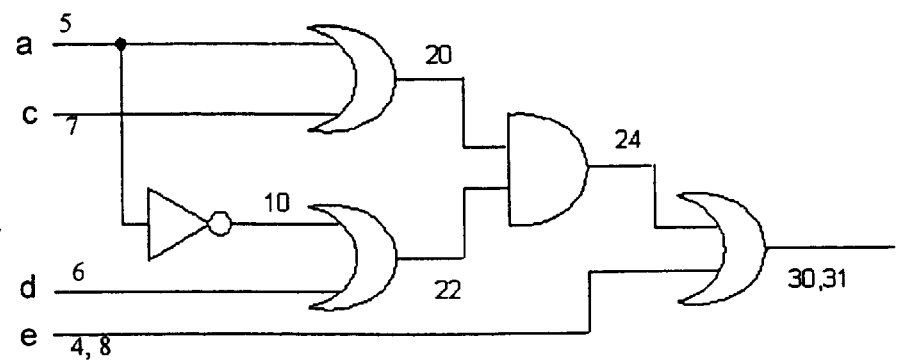
FIG. 14 shows a circuit in the comparison of FIG. 13 after replacement.

Now the method applies the steps in FIG. 7 to the upper circuit in FIG. 13. Starting from the outputs (breadth-first search), the first net that has a match in the Equivalence table is net numbered 16. This net number was shown equivalent to net number 24 (from Stage tag 3) earlier. Since Stage tag 3 is closer to Stage tag 4 than Stage tag 2, the preferred embodiment invokes Step 718 to make a replacement to the OR gate numbered 29, 16 in FIG. 13. The goal is to replace this net by a net that will correspond to number 24. The circuit obtained after doing the replacement is shown in FIG. 14. Using the Numbering table and the Structure numbers, the following replacement sub-circuit is obtained:

24 is AND, 20, 22;

20 is OR, 5, 7;

5 is DFS number 1 (input a for the verification in FIG. 13);

7 is DFS number 3 (input c for the verification in FIG. 13);

22 is OR, 10, 6;

10 is NOT, 5; and

6 is DFS number 27 (input d for the verification in FIG. 13).

Deriving this circuit in Step 718 and replacing the net numbered 16 in the top circuit of FIG. 13 yields the circuit in FIG. 14. Next, the modified circuit in FIG. 14 is verified against the lower circuit in FIG. 13. This verification adds new additions to the Equivalence table as shown in TABLE IX.

TABLE IX

| Net | Equivalent Nets |
| --- | --- |
| 30 | 40 |
| 40 | 30 |
| 31 | 41 |
| 41 | 31 |

Figure 15:
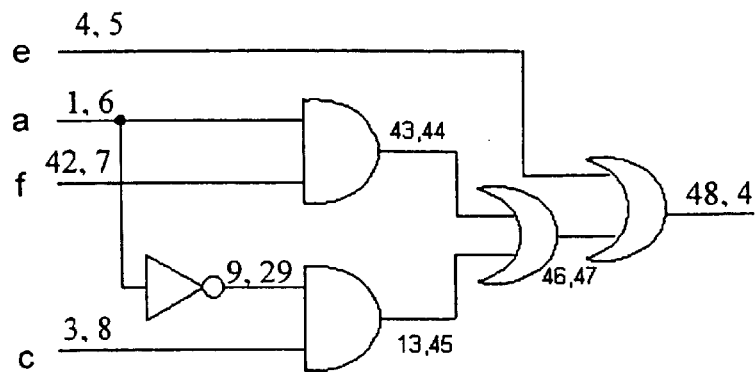
FIG. 15 shows a subcircuit comparison subsequent to the comparisons in FIGS. 12 and 13 in which neither Named numbering nor Structure numbering is effective.
Figure 15:
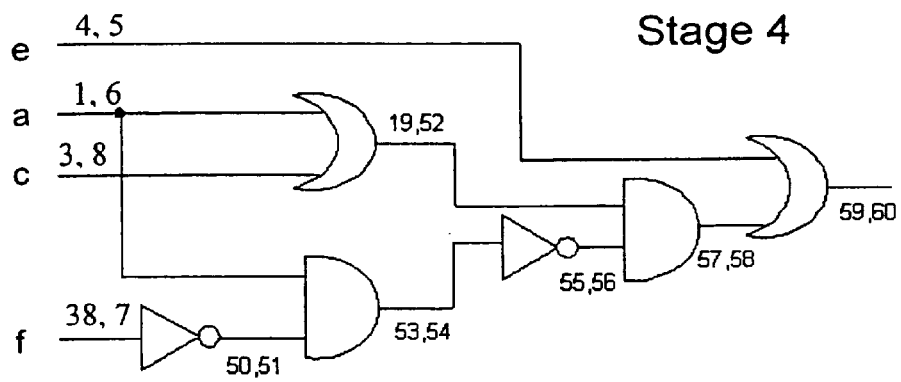

As another example, consider verification of the circuits in FIG. 15 which respectively have stage tags of 2 and 4. The numberings on the nets reflect the Named and Structure numbering. It would be preferable to replace a subcircuit of the upper circuit with a subcircuit from a stage closer to stage 4; however, none of the intermediate net numbers in the upper (or in the lower) circuit have a match in the equivalence table. Note that the two circuits in FIG. 15 are very similar to the circuits in FIG. 13; the only differences are that the input e appears first in the depth-first order, instead of last; and input f replaces input d from FIG. 15. These two differences are, however, enough to make the Structure numbering and Named numbering, respectively, ineffective.

Figure 16:
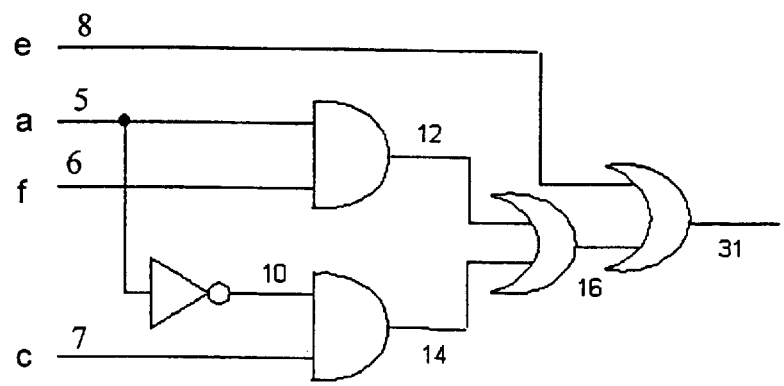
FIG. 16 shows a subcircuit comparison having numbered intermediate nets.
Figure 16:
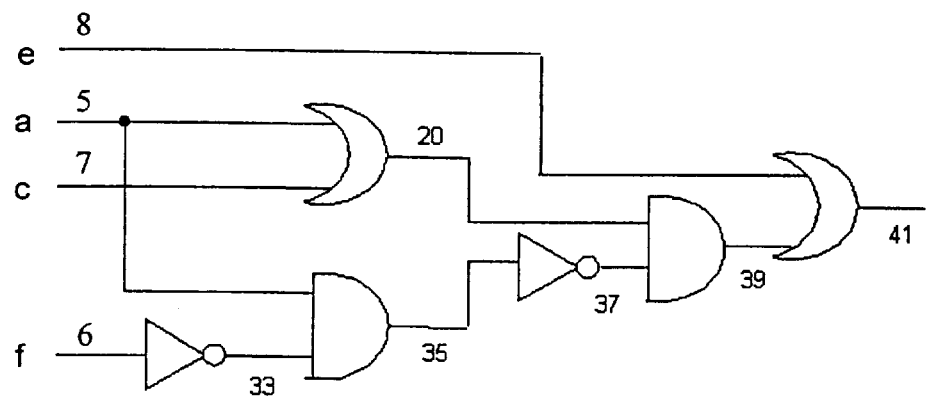

If another numbering system were used for the inputs, however, it is possible to replace a subcircuit in the upper circuit with a subcircuit from stage 4. Consider the following input numbering, which does not follow either the Named numbering system or the Structure numbering system: a is 5; c is 7; e is 8; and f is 6. Using this input numbering, the numbering can be propagated forward toward the outputs using the steps of FIG. 6. This numbering on intermediate nets is shown in FIG. 16.

Once the numbering has been established, the Equivalence table can be used effectively. According to the Equivalence table, the net numbered 31 is equal to the net numbered 41 from stage 4. Since this allows the net numbered 31 from Stage 2 in the upper circuit of FIG. 16 to be replaced by the net numbered 41, this numbering results in a perfect replacement in this example.

Figure 17:
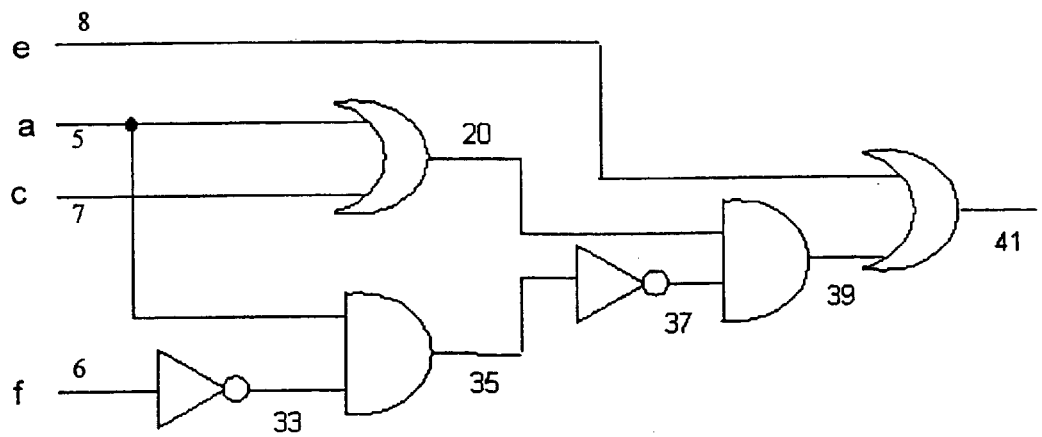
FIG. 17 shows a replacement circuit resulting from the comparison of FIG. 16.

The replacement circuit is again built in Step 718 and results in the circuit shown in FIG. 17. Notice that this circuit is in fact identical to the lower circuit of FIG. 16. Thus, the preferred embodiment has reduced the verification problem to a much simpler one.

The methods and implementing apparatus of the present invention have been described in connection with the preferred embodiments as disclosed herein. Although exemplary embodiments of the present invention have been shown and described in detail herein, along with certain variants thereof, other varied embodiments which incorporate the teachings of the invention may easily be constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention. In other instances, well known structures are not shown in detail but can readily constructed by those skilled in the art.

What is claimed is:

1. A method of verifying combinational circuits comprising:
choosing a cutpoint candidate pair from a group of at least one cutpoint candidate pairs, each cutpoint candidate pair including two circuits;
determining whether or not the circuits in the chosen cutpoint candidate pair are equivalent to one another;
when the circuits in the chosen cutpoint candidate pair are found to be equivalent, storing a record of the equivalency of the two circuits in an equivalence data structure; and
processing for replacement, the processing for replacement comprising:
choosing a net within a circuit in the chosen cutpoint candidate pair;
determining, using the equivalence data structure, other nets equivalent to the chosen net;
selecting one of the other nets which has a closest stage number to the other circuit in the chosen cutpoint candidate pair, amongst all of the other nets;
if the selected net has a closer stage number to the other circuit than does the chosen net, constructing a new sub-circuit using the equivalence data structure; and
replacing the chosen net by the new sub-circuit.

2. The method of claim 1, wherein the equivalence structure has predefined information not derived from cutpoint candidate pairs.

3. A method of verifying combinational circuits comprising:
choosing a cutpoint candidate pair from a group of at least one cutpoint candidate pairs, each cutpoint candidate pair including two circuits;
determining whether or not the circuits in the chosen cutpoint candidate pair are equivalent to one another;
when the circuits in the chosen cutpoint candidate pair are found to be nonequivalent, storing a record of the nonequivalency of the two circuits in a vector data structure in a persistent database for use in future runs; and
preparing a group of at least one simulation vector, based on the vector data structure stored in the persistent database from past runs, for use in a subsequent cutpoint candidate circuit equivalence determination.

4. The method of claim 3, wherein preparing a group of at least one simulation vector comprises:
choosing a net within a circuit in the chosen cutpoint candidate pair;
determining name number indicia associated with the chosen net;
finding records in the vector data structure that match a number indicia associated with the chosen net;
constructing a new vector using the nonequivalency data structure; and
using the new vector for simulation.

5. A method of verifying combinational circuits comprising:
choosing a cutpoint candidate pair from a group of at least one cutpoint candidate pairs, each cutpoint candidate pair including two circuits;
determining whether or not the circuits in the chosen cutpoint candidate pair are equivalent to one another;
when the circuits in the chosen cutpoint candidate pair are found to be equivalent, storing a record of the equivalency of the two circuits in an equivalence data structure in a persistent database for use in future runs;
when the circuits in the chosen cutpoint candidate pair are found to be nonequivalent, storing a record of the nonequivalency of the two circuits in a vector data structure in the persistent database for use in future runs;
replacing, based on information in the equivalence data structure stored in the persistent database from past runs, a portion of a circuit in the chosen cutpoint candidate pair with an equivalent circuit to produce a modified cutpoint candidate pair; and
preparing a group of at least one simulation vector, based on the vector data structure stored in the persistent database from past runs, for use in a subsequent equivalence determination on the modified cutpoint candidate pair.

6. A method of verifying functional equivalence of two circuits, the method comprising:
reading data describing the two circuits;
detecting corresponding mapping points in the two circuits;
correlating the mapping points in the two circuits;
partitioning the two circuits and preparing combinational comparison data therefor; and comparing subcircuit data for the partitioned circuits based on the comparison data, the comparison using data stored in a persistent database for use in future runs and obtained from previous functional equivalence checks.

7. The method of claim 6, wherein the data stored in the cache includes equivalence data establishing equivalency of pairs of subcircuits.

8. The method of claim 6, wherein the data stored in the cache includes vector data providing vectors showing nonequivalence of pairs of subcircuits.

9. The method of claim 6, further comprising storing results of the subcircuit comparison in the cache for use in subsequent functional equivalence checks.

10. The method of claim 6, wherein the data stored in the cache includes predetermined equivalence information not derived from equivalence checks.

11. A computer-readable information storage medium having data stored thereon for programming a computer to comprise:
means for choosing a cutpoint candidate pair from a group of at least one cutpoint candidate pairs, each cutpoint candidate pair including two circuits;
means for determining whether or not the circuits in the chosen cutpoint candidate pair are equivalent to one another;
means for, when the circuits in the chosen cutpoint candidate pair are found to be equivalent, storing a record of the equivalency of the two circuits in an equivalence data structure in a persistent database for use in future runs; and
means for processing for replacement, based on information in the equivalence data structure stored in the persistent database from past runs, a portion of a circuit in the chosen cutpoint candidate pair with an equivalent circuit for use in a subsequent cutpoint candidate circuit equivalence determination.

12. A computer-readable information storage medium having data stored thereon for programming a computer to comprise:
means for choosing a cutpoint candidate pair from a group of at least one cutpoint candidate pairs, each cutpoint candidate pair including two circuits;
means for determining whether or not the circuits in the chosen cutpoint candidate pair are equivalent to one another;
means for, when the circuits in the chosen cutpoint candidate pair are found to be nonequivalent, storing a record of the nonequivalency of the two circuits in a vector data structure in a persistent database for use in future runs; and
means for preparing a group of at least one simulation vector, based on the vector data structure stored in the persistent database from past runs, for use in a subsequent cutpoint candidate circuit equivalence determination.

13. A computer-readable information storage medium having data stored thereon for programming a computer to comprise:
means for choosing a cutpoint candidate pair from a group of at least one cutpoint candidate pairs, each cutpoint candidate pair including two circuits;
means for determining whether or not the circuits in the chosen cutpoint candidate pair are equivalent to one another;
means for, when the circuits in the chosen cutpoint candidate pair are found to be equivalent, storing a record of the equivalency of the two circuits in an equivalence data structure in a persistent database for use in future runs;
means for, when the circuits in the chosen cutpoint candidate pair are found to be nonequivalent, storing a record of the nonequivalency of the two circuits in a vector data structure in the persistent database for use in future runs;
means for replacing, based on information in the equivalence data structure stored in the persistent database from past runs, a portion of a circuit in the chosen cutpoint candidate pair with an equivalent circuit to produce a modified cutpoint candidate pair; and
means for preparing a group of at least one simulation vector, based on the vector data structure stored in the persistent database from past runs, for use in a subsequent equivalence determination on the modified cutpoint candidate pair.

14. A method for determining functional equivalence between circuit models, the method comprising:
partitioning circuits into combinational logic subcircuits at register boundaries;
verifying equivalence of two combinational logic subcircuits using at least one method for numbering corresponding inputs of the two subcircuits;
propagating these numbers to the remainders of the two subcircuits so that each net in both circuits has a number based on one of the input numbering methods;
caching the equivalence of two numbered nets when a combinational engine finds that two nets are equivalent;
caching the nonequivalence of two numbered nets, and a corresponding differentiating vector, when the combinational engine finds that two nets are nonequivalent;
determining whether the cache stores equality of any net to a selected net in a current check;
selecting a subcircuit matching the selected net based on closeness of stage numbers of the subcircuits;
constructing a combinational subcircuit based on the selected subcircuit;
replacing a combinational subcircuit rooted at any net by the constructed subcircuit for a cache match;
checking whether the cache stores a test vector for any net in the current check;
constructing an input test vector based on a matched test vector seen in the cache; and
simulating the constructed test vector.

15. A method of verifying combinational circuits comprising:
receiving two subcircuits, the two subcircuits constituting a cutpoint candidate pair;
numbering input nodes of the subcircuits based on a predetermined correspondence of input nodes with numbers;
deriving numbers for intermediate nodes of the subcircuits based on the numbers for input nodes and other intermediate nodes; and
generating equivalency information about the subcircuits using the input node numbers.

16. The method of claim 15, wherein the numbering is based on names of the input nodes.

17. The method of claim 16, wherein the numbering comprises:

recursively searching through the subcircuits to find inputs thereof, the searching beginning at outputs of the subcircuits;

associating a Named number with each input name in the first subcircuit; and associating a Named number with each input name in the second subcircuit.

18. The method of claim 17, wherein associating a Named number with each input name in one of the subcircuits comprises, for each input node encountered during the search:

accessing a Numbering table to determine if the input name of the input node has a Named number associated therewith in the Numbering table, if the input name has a Named number associated therewith, associating that Named number with the input node, and if the input name does not have a Named number associated therewith, generating a new Named number and making an entry in the Numbering table associating the input name with the new Named number.

19. The method of claim 15, wherein the numbering is based on structural positions of the input nodes.

20. The method of claim 19, wherein the numbering is done by:

depth-first searching through the subcircuits to find inputs thereof, the searching beginning at outputs of the subcircuits;

associating a Structure number with each input position in the first subcircuit; and associating a Structure number with each input position in the second subcircuit.

21. The method of claim 20, wherein associating a Named number with each input position in one of the subcircuits comprises, for each input node encountered during the search:

accessing a Numbering table to determine if the input position of the input node has a Structure number associated therewith in the Numbering table, if the input position has a Structure number associated therewith, associating that Structure number with the input node, and if the input position does not have a Structure number associated therewith, generating a new Structure number and making an entry in the Numbering table associating the input position with the new Structure number.

22. The method of claim 15, further comprising after numbering the input nodes of the subcircuits, numbering intermediate nodes thereof by:

choosing an intermediate net not having a numbered output but having numbered inputs and determining whether numbers for the net's inputs and gate type appear in an entry in a Numbering table;

if the net inputs and gate type do appear in an entry, associating the output of the net with a net output in the entry;

if the net inputs and gate type do not appear in an entry, generating a new number, associating it with the net output, and storing an entry associating the net input numbers, gate type and net output number in the Numbering table.

* * * * *